US007789576B2

(12) United States Patent
Lee et al.

(10) Patent No.: US 7,789,576 B2
(45) Date of Patent: Sep. 7, 2010

(54) PEB EMBEDDED EXPOSURE APPARATUS

(75) Inventors: Feng-Ning Lee, Longtan Shiang (TW);
Yung-Cheng Chen, Jhubei (TW);
Yao-Hwan Kao, Hsinchu County (TW);
Li-Jen Ko, Zhuebi (TW); Chin-Hsiang Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 605 days.

(21) Appl. No.: 11/740,129

(22) Filed: Apr. 25, 2007

(65) Prior Publication Data

US 2008/0241760 A1 Oct. 2, 2008

Related U.S. Application Data

(60) Provisional application No. 60/908,371, filed on Mar. 27, 2007.

(51) Int. Cl.
*G03D 5/00* (2006.01)
*G03B 27/32* (2006.01)
*G03F 1/00* (2006.01)

(52) U.S. Cl. .................. 396/611; 355/27; 430/311; 430/330

(58) Field of Classification Search .................. 355/27, 355/53, 77; 396/611; 430/311, 5, 322, 323, 430/324, 330; 700/121
See application file for complete search history.

(56) References Cited

U.S. PATENT DOCUMENTS 3,946,484 A * 3/1976 Aronstein et al. ......... 29/25.01

| 2004/0155026 | A1* | 8/2004 | Mandal | 219/465.1 |
| 2006/0134330 | A1* | 6/2006 | Ishikawa et al. | 427/248.1 |
| 2006/0246357 | A1* | 11/2006 | Chen et al. | 430/5 |
| 2007/0003842 | A1* | 1/2007 | Wang et al. | 430/5 |
| 2008/0069954 | A1* | 3/2008 | Lin | 427/255.28 |
| 2008/0145791 | A1* | 6/2008 | Onvlee et al. | 430/311 |

FOREIGN PATENT DOCUMENTS

CN   1854889(A)   11/2006

OTHER PUBLICATIONS

English Translation of Chinese Office Action (dated Sep. 4, 2009).*
Hori, Shinya, et al., "Critical Dimension (CD) Control in 157-nm Lithography", SPIE, vol. 5039, Jun. 12, 2003, pp. 1333-1342.
Ku, Chin-Yu, et al., "Real-Time Process Control to Prevent CD Variation Induced by Post Exposure Delay", SPIE, vol. 4182, Aug. 23, 2000, pp. 40-47.
Yamana, Mitsuharu, et al, "Deblocking Reaction of Chemically Amplified ArF Positive Resists", SPIE, vol. 3333, Jun. 29, 1998, pp. 33-42.
Chinese Patent Office, Chinese Office Action mailed Sep. 4, 2009, 5 pages, Application No. 2008100880487.

* cited by examiner

*Primary Examiner*—Alan A Mathews
(74) *Attorney, Agent, or Firm*—Haynes and Boone, LLP

(57) ABSTRACT

The present disclosure provides a lithography apparatus. The apparatus includes an exposure module designed for exposure processing; a baking module embedded in the exposure module and designed for post exposure baking (PEB); and a control module designed to control the exposure module and the baking module.

18 Claims, 6 Drawing Sheets

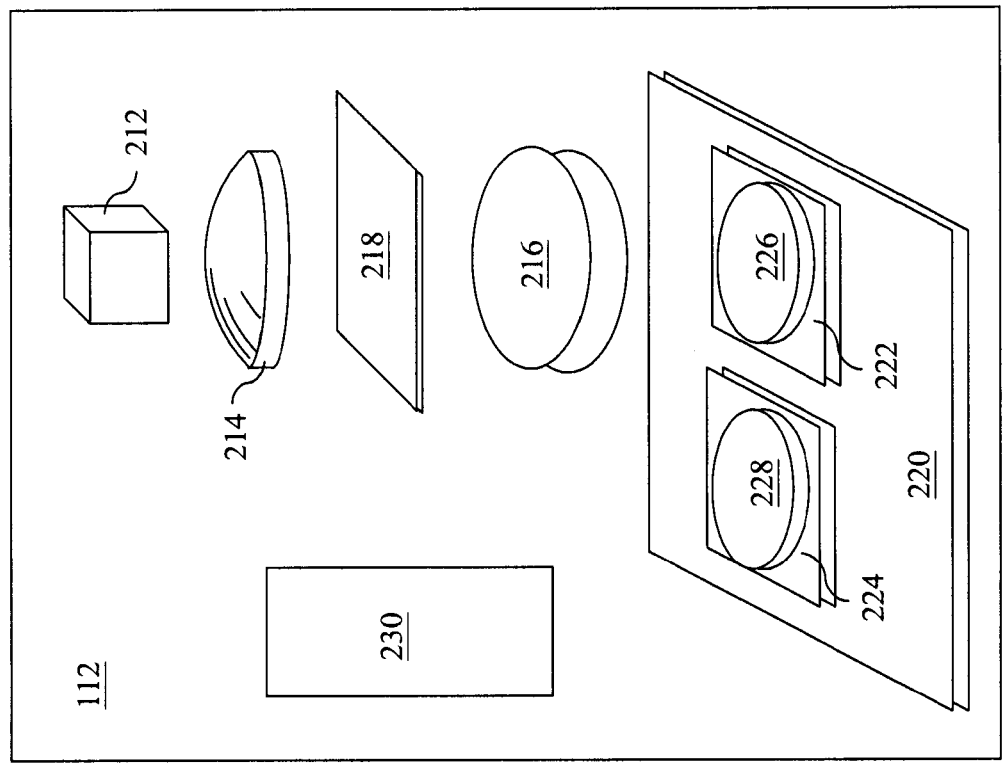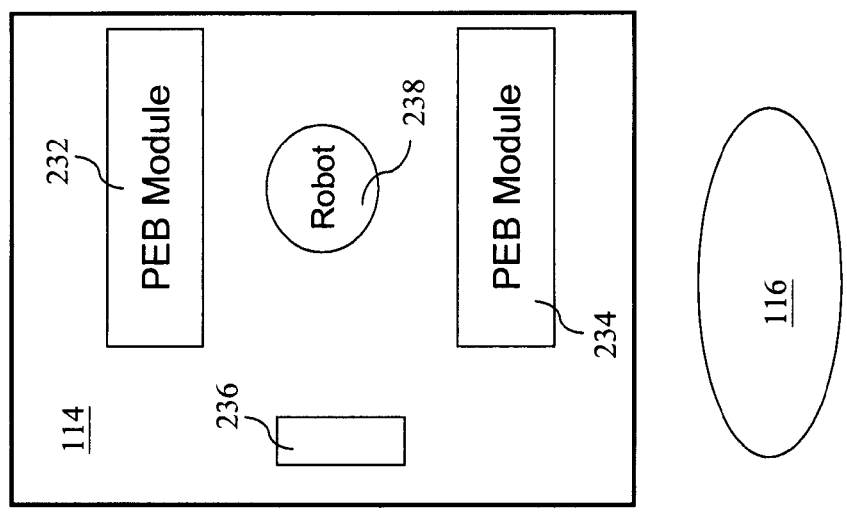
Fig. 2

PEB EMBEDDED EXPOSURE APPARATUS

BACKGROUND

Photolithography processes are used to pattern substrates, such as semiconductor wafers, using photomasks or masks. The patterns are used to create integrated circuits (ICs) are continually decreasing in feature size and spacing and/or increasing in density. As a result of this continuous progression, various light sources and photoresist materials have been used. For example, chemical amplified photoresist (CAR) may be used with deep ultraviolet (DUV) light for nanometer-scale lithography process and IC fabrication. However, the DUV photoresist material is sensitive to post exposure delay and existing exposure apparatuses are difficult to maintain an acceptable level of post exposure delay, causing variations of line width and decreased uniformity of critical dimensions.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

FIG. 2 illustrates a schematic view of one embodiment of an exposure apparatus with an embedded baking module constructed according to aspects of the present disclosure.

DETAILED DESCRIPTION

The present disclosure relates generally to lithography systems and a method of utilizing such systems for lithography patterning. It is understood, however, that the following disclosure provides many different embodiments, or examples, for implementing different features of the invention. Specific examples of components and arrangements are described below to simplify the present disclosure. These are, of course, merely examples and are not intended to be limiting.

Figure 1:
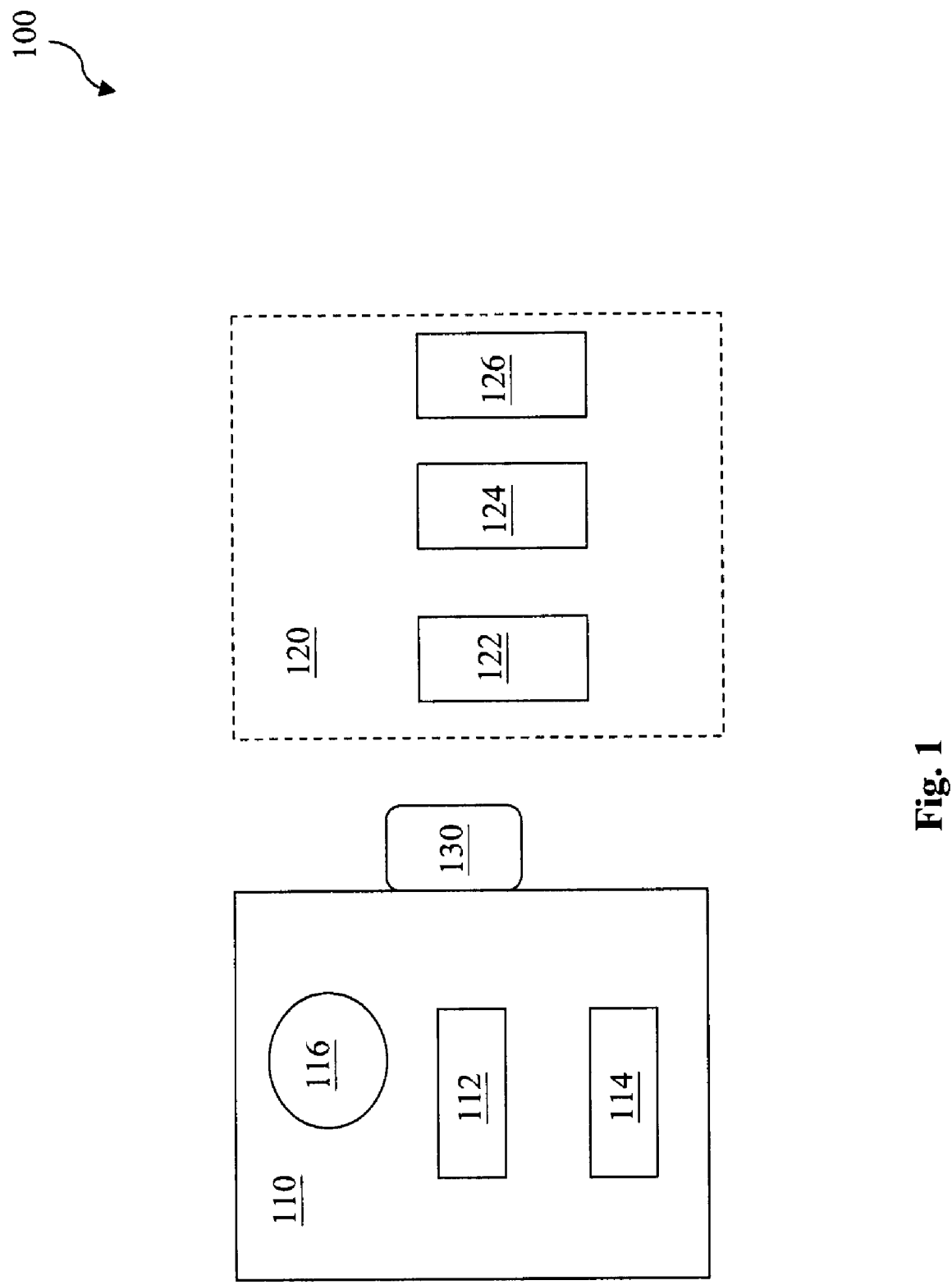
FIG. 1 is a block diagram of an exemplary embodiment of a lithography system with an embedded baking module in an exposure apparatus constructed according to aspects of the present disclosure.

Referring to FIG. 1, illustrated is a schematic view of an exemplary embodiment of a lithography system 100 constructed according to aspects of the present disclosure. The lithography system 100 is configured and designed to reduce impact from post exposure delay time and to provide uniform critical dimension (UCD) of a resist pattern formed in a lithography patterning process.

The lithography system 100 includes an exposure apparatus 110 having an exposure module 112 and an embedded baking module 114. The exposure module 112 is designed for exposure processing to a substrate (such as a semiconductor wafer). The embedded baking module 114 is designed for applying a post exposure baking (PEB) process to the substrate after it has been applied of the exposure processing in the exposure module 112. The exposure apparatus 110 further includes a control module 116 having both hardware and software integrated and designed for control the exposure apparatus 110 including controlling the exposure module 112 for exposure processing, controlling the baking module 114 for PEB, and controlling the coordination between the exposure and baking modules. The hardware and/or software can also be used for controlling post exposure delay time, compensating PEB deviation, and increasing manufacturing efficiency, as further described later.

The lithography system 100 includes a track unit 120 for photoresist (resist) processing. The track unit 120 includes a resist coating module 122, a resist developing module 124, and a resist baking unit 126 designed for soft baking, hard baking and/or other proper baking processes. The track unit 120 may further include other modules such as adhesion priming and integrated metrology. The various modules of the track unit 120 may be standalone, clustered, or integrated otherwise. The track unit 120 itself may be standalone, clustered, or coordinated with the exposure apparatus 110.

The exposure apparatus 110 may further include or be integrated to an interface module 130 for communicating and/or transferring wafers between the exposure apparatus 110 and the track unit 120. In one embodiment, the interface module 130 further includes various load ports for loading to and unloading from the exposure apparatus 110. In another embodiment, the exposure apparatus 110 includes various mechanism of wafer transferring in/out from the exposure apparatus to the track unit 120 clustered with the exposure apparatus 110.

FIG. 2 illustrates a schematic view of an embodiment of an exposure apparatus, such as the exposure apparatus 110 of FIG. 1, constructed according to aspects of the present disclosure. The exposure apparatus 110 includes an exposure module 112. The exposure module 112 includes a radiation source 212 to provide radiation beams (radiation energy). The radiation source 212 may be a suitable light source such as an ultra-violet (UV), or deep ultra-violet (DUV) source. More specifically, the radiation source 212 may be, a mercury lamp having a wavelength of 365 nm (I-line); a Krypton Fluoride (KrF) excimer laser with wavelength of 248 nm; or an Argon Fluoride (ArF) excimer laser with a wavelength of 193 nm.

The exposure module 112 includes an illumination module (e.g., a condenser) 214 having a single lens, or multiple lenses and other lens components. For example, the illumination module 214 may include microlens arrays, shadow masks, or other structures designed to aid in directing radiation beams from the radiation source 212 onto a photomask (also referred to as a "mask" or "reticle"). The illumination module 214 may be integrated with the radiation source 212.

The exposure module 112 also includes an imaging lens module 216. The imaging lens module 216 may have a single lens or a plurality of lens elements configured to project the radiation beam onto a substrate.

The exposure module 112 may further include a mask stage 218 configured to hold a mask and designed to manipulate the mask in various motion modes such as transitional and/or rotational modes. The mask stage 218 may be positioned between the illumination module 214 and the imaging lens module 216. The mask to be utilized may include a transparent substrate such as fused silica ($SiO_2$). The mask may further include a pre-designed mask pattern formed on and/or in the substrate or may only be a blank. The mask pattern is designed according to integrated circuit features to be formed on a semiconductor substrate (such as a wafer). In one embodiment, the mask pattern may include an absorption layer formed using a plurality of processes and materials. The absorption layer is patterned to have one or more openings where radiation beams may travel through without being absorbed and have one or more absorption areas where the radiation beams may be completely or partially blocked thereby. In another embodiment, the mask pattern may include phase shift features formed above, on and/or at least partially in the substrate by etching thereof. The pattern layer may be a binary intensity mask (BIM or binary mask) including chrome areas and transparent fused silica areas In another embodiment, the mask pattern may be an alternating phase shift mask (AltPSM), employing alternating areas of chrome and 180 degree-shifted quartz. In another embodiment, the mask pattern may be an attenuating phase shift mask (AttPSM), employing an attenuating feature having a phase shift relative to the transparent substrate. Alternatively, the mask pattern may be a chromeless phase shift pattern. In another embodiment, the mask pattern may include a combination of binary features and various phase shift features. Additionally, the mask pattern may include various optical proximity correction (OPC) features designed for fixing an optical proximity affect.

The exposure module 112 includes a substrate stage 220 for holding a semiconductor substrate 226 to be patterned and manipulating the substrate in transitional and/or rotational modes during a lithography patterning process. The substrate stage 220 may further include a substrate chuck 222 for holding and moving the substrate 226 during an exposure process. For throughput enhancement purpose, the substrate stage 220 may further include another substrate chuck 224, which is physically identical to substrate chuck 222. In one embodiment, while substrate chuck 222 is executing the exposure process of substrate 226, the substrate chuck 224 is carrying another substrate 228 and executing the inspection and/or measurement process. After substrate chuck 222 completes the exposure process on substrate 226 and substrate chuck 224 completes the measurement process on substrate 228, substrate chuck 222 can send on substrate 226 to a stage in/out sub-module 230 described below and pick up a new substrate for measurement process while substrate chuck 224 will move to the previous position of substrate chuck 222 and execute exposure process on substrate 228. The substrate 226 or 228 may be a semiconductor wafer having silicon, germanium, diamond, or a compound semiconductor. The substrate 226 or 228 may alternatively include other materials such as glass for thin-film transistor liquid crystal display (TFT_LCD) devices or fused silicon/calcium fluoride for photomask. The substrate 226 or 228 may include a plurality of layers formed thereon, each having patterned structures. The substrate 226 or 228 may include a material layer formed thereon and to be patterned. The substrate 226 is further coated with an imaging layer such as photoresist for lithography patterning process. An exemplary photoresist material includes chemical amplified photoresist (CAR).

The exposure module 112 may further include a stage in/out sub-module 230 for transferring a substrate between the exposure module 112 and an embedded baking module described below.

Figure 4:
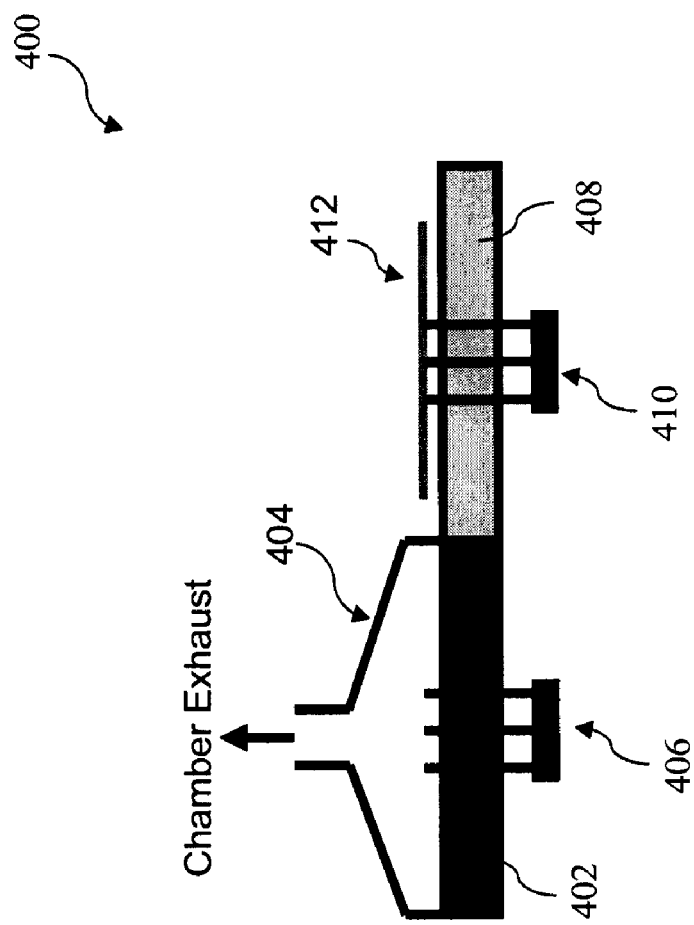
FIG. 4 illustrates a schematic view of one embodiment of an embedded baking module which may be configured in the system of FIG. 1 or the apparatus of FIG. 2 constructed according to aspects of the present disclosure.
Figure 3:
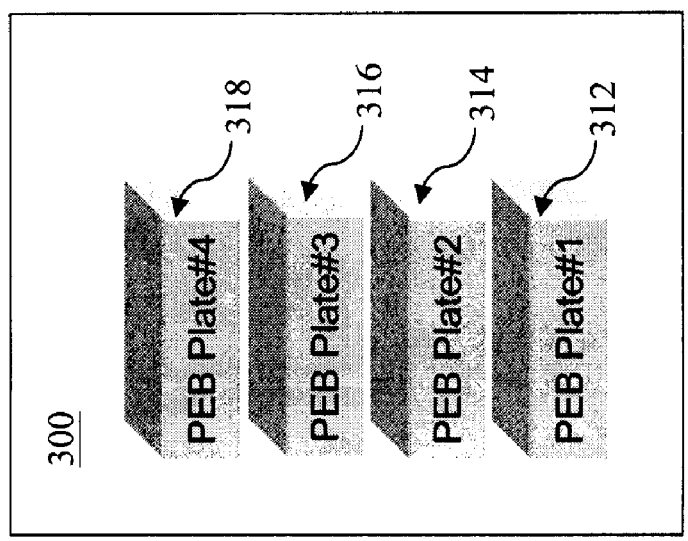
FIG. 3 illustrates a schematic view of one embodiment of an embedded baking module which may be configured in the system of FIG. 1 or the apparatus of FIG. 2 constructed according to aspects of the present disclosure.

The exposure apparatus 110 further includes the embedded baking module 114 designed for post exposure baking (PEB). The embedded baking module 114 includes one or more PEB sub-module such as exemplary PEB sub-modules 232 and 234 configured in various locations. Each PEB sub-module may further include various baking plates stacked with enhanced baking capacity, such as PEB sub-module 300 illustrated in FIG. 3, having various baking plates 312, 314, 316 and 318 configured in stack. Each baking plate may have an exemplary structure 400 illustrated in FIG. 4 in a schematic view. The baking plate 400 includes a hot plate 402 designed for post exposure baking. The baking plate 400 may further include a chamber cover 404 for covering the substrate on the hot plate 402 during a baking process. The chamber cover 404 may be further designed or integrated with a chamber exhaust during a baking process. The baking plate 400 further includes a mechanism 406 for providing heat to the hot plate 402. The baking plate 400 may further include a chilling plate 408 proximate to the hot plate 402, designed for cooling down a substrate, such as an exemplary substrate 412, after being post exposure baked. The baking plate 400 may further include a mechanism 410 for draining heat from the baked substrate 412.

Return to FIG. 2, the baking module 114 may further include an interface sub-module 236 for transferring in a substrate to be exposed and post exposure baked, and transferring out a substrate having been exposed and baked from the exposure apparatus 110 for following processes such as developing and hard baking.

The baking module 114 may further include a mechanism 238 such as a robot for transferring a substrate among various baking plates, the stage in/out sub-module 230 of the exposure module 112, and the interface 236.

Return to FIG. 1, the exposure apparatus 110 further includes a control module 116 for controlling the exposure module 112 and the baking module 114 with enhanced manufacturing efficiency, optimized post exposure delay time, and/or compensated PEB. In one embodiment, the control module 116 is designed capable of assigning one baking plate (such as 312, 314, 316, or 318 of FIG. 3) of the baking module 114 for applying PEB to a substrate before or during exposure of the substrate. In another embodiment, the control module 116 can determine when to perform the exposure to the substrate according to the availability of the baking module or specifically, the availability of the assigned baking plate, to reduce the post exposure delay time and/or control the post exposure delay time such that the post exposure delay time is unified over various substrates. In another embodiment, the control module 116 can assign an exposure recipe to the substrate in which the exposure recipe is tuned and associated to the baking plate assigned to the substrate. In this way, variations from one baking plate to another baking plate can be compensated. Thus wafer-to-wafer PEB variation can be eliminated or reduced.

Further, the exposure recipe associated to the assigned baking plate may include exposure dose variations from field to field according to thermal variation from one area to area in the assigned baking plate in order to compensate within-wafer PEB deviation. In another embodiment, the control module 116 may include a database incorporating information of the thermal distribution of each baking plate. Further, the control module may include a plurality of exposure recipes, each being tuned to and associated with one of the plurality of baking plates in the baking module 114. Furthermore, the database may also include a plurality of baking recipes each being tuned to and associated with one of the plurality of baking plates in the baking module 114. The disclosed PEB-embedded exposure apparatus can keep uniform post exposure delay time (PED), improve wafer-to-wafer critical dimension uniformity (CDU), and/or maintain through-pitch optical proximity effect (OPE). Furthermore, the disclosed PEB-embedded exposure apparatus can dispatch a wafer to a pre-defined baking plate after exposure to further improve wafer-to-wafer and within-wafer CDU. The disclosed PEB-embedded exposure apparatus can predefine several exposure recipes to several baking plates according to the signature of each baking plate.

Figure 5:
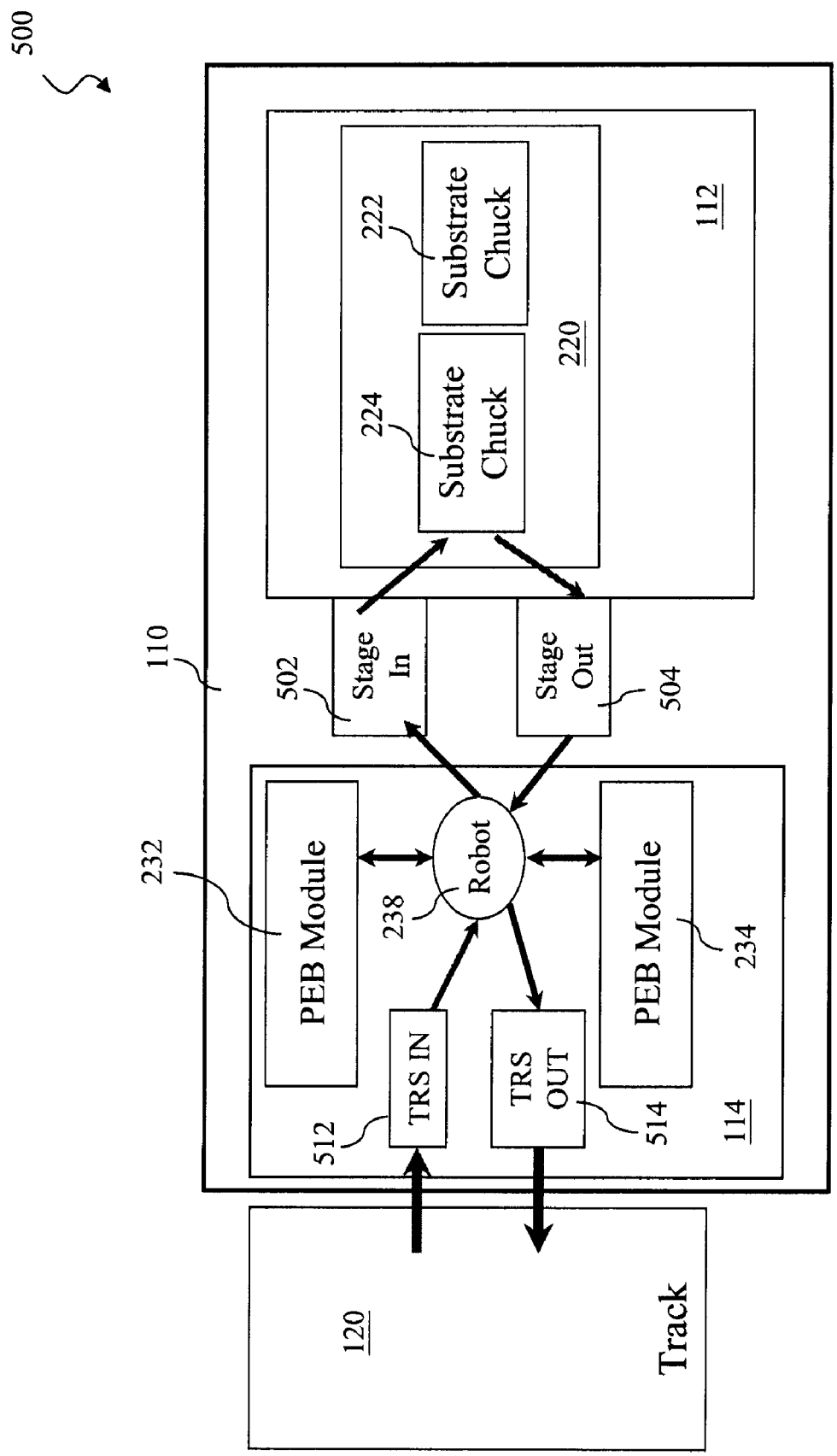
FIG. 5 illustrates a schematic view of one example of an exposure apparatus with an embedded baking module constructed according to aspects of the present disclosure.
Figure 6:
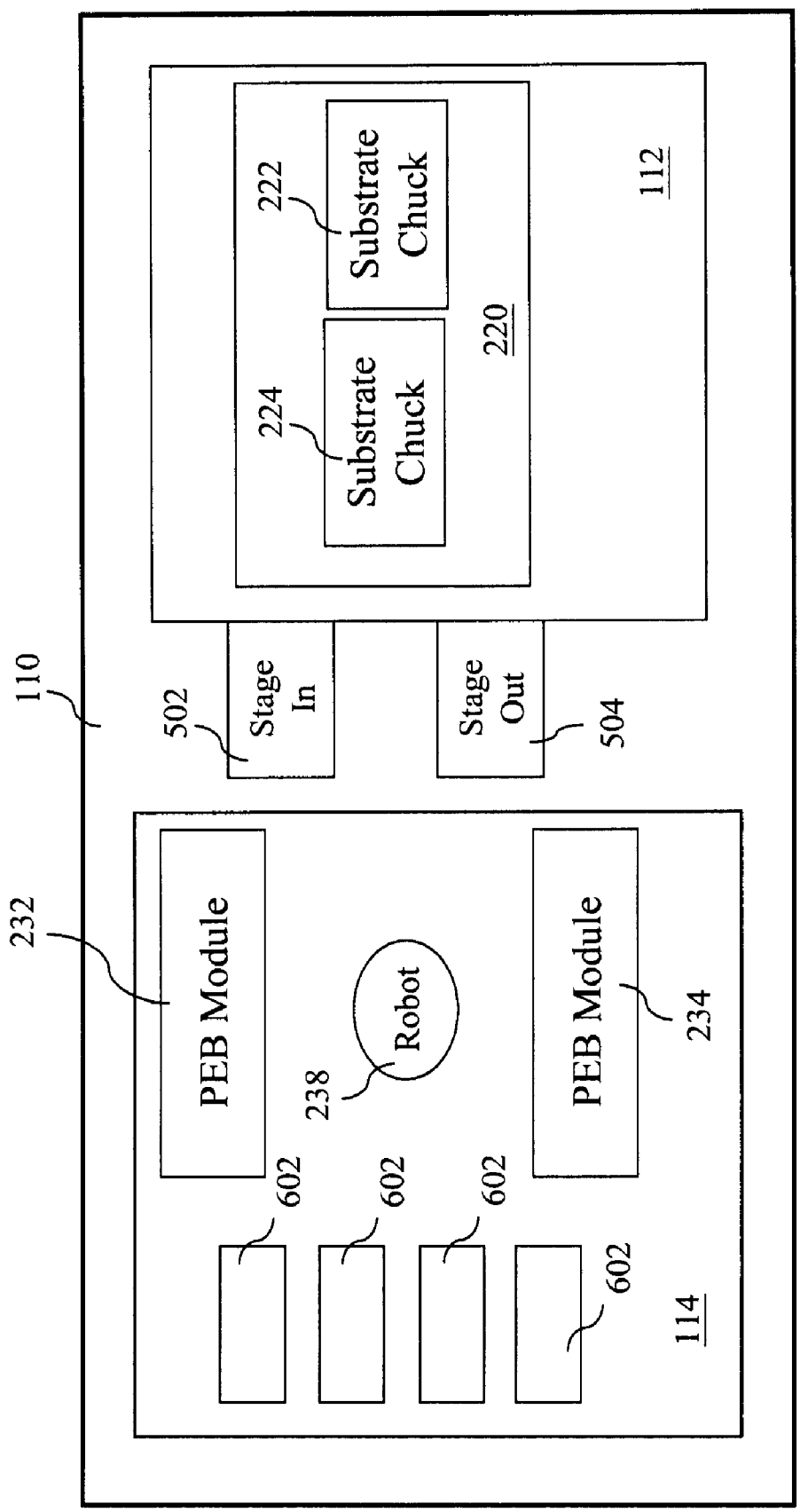
FIG. 6 illustrates a schematic view of another example of an exposure apparatus with an embedded baking module constructed according to aspects of the present disclosure.

FIGS. 5 and 6 are block diagrams each illustrating one example of a PEB-embedded exposure apparatus constructed according to aspects of the present disclosure. In FIG. 5, a lithography system 500 includes a PEB-embedded exposure apparatus 110 clustered with a track unit 120. The exposure apparatus 110 includes an exposure module 112 for exposure processing, which may be similar to the exposure module 112 of FIG. 1 or FIG. 2 (some portions, such as optical units and metrology module, of the exposure module are not shown here for simplicity). The exposure module 112 includes a wafer stage 220 with an exposure chuck 222 and a metrology chuck 224 integrated therewith. The exposure apparatus 110 also includes stage-in 502 and stage-out 504 designed and configured for transferring wafers into or out from the exposure module 112, respectively. The exposure apparatus 110 also includes an embedded baking module 114 for post exposure baking. The baking module 114 further includes various PEB baking sub-module 232 and 234 (each may have one or more baking plates), a robot 238 for transferring wafers among various baking plates, stage-in 502, stage-out 504, wafer transfer-in unit 512 and wafer transfer-out unit 514. The wafer transfer-in unit 512 and wafer transfer-out unit 514 are configured to transfer wafers between the exposure apparatus 110 and the track unit 120. The track unit 120 may be similar to the track unit 120 of FIG. 1.

In FIG. 6, the PEB-embedded exposure apparatus 110 stands alone. The exposure apparatus 110 includes an exposure module 112 for exposure processing, which is similar to the exposure module 112 of FIG. 1 or FIG. 2 (some portions, such as optical units, of the exposure module are not shown here for simplicity). The exposure module 112 includes a wafer stage 220 with two substrate chucks 222 and 224 integrated therewith. The exposure apparatus 110 also includes stage-in 502 and stage-out 504 designed and configured for transferring wafers into or out from the exposure module 112, respectively. The exposure apparatus 110 also includes an embedded baking module 114 for post exposure baking. The baking module 114 further includes various PEB baking sub-module 232 and 234 (each may has one or more baking plate), a robot 238 for transferring wafers among various baking plates, stage-in 502, stage-out 504, and various load ports 602 to transfer wafers in for performing exposure and baking processes and to transfer wafers out for following processes including developing and hard baking.

Figure 7:
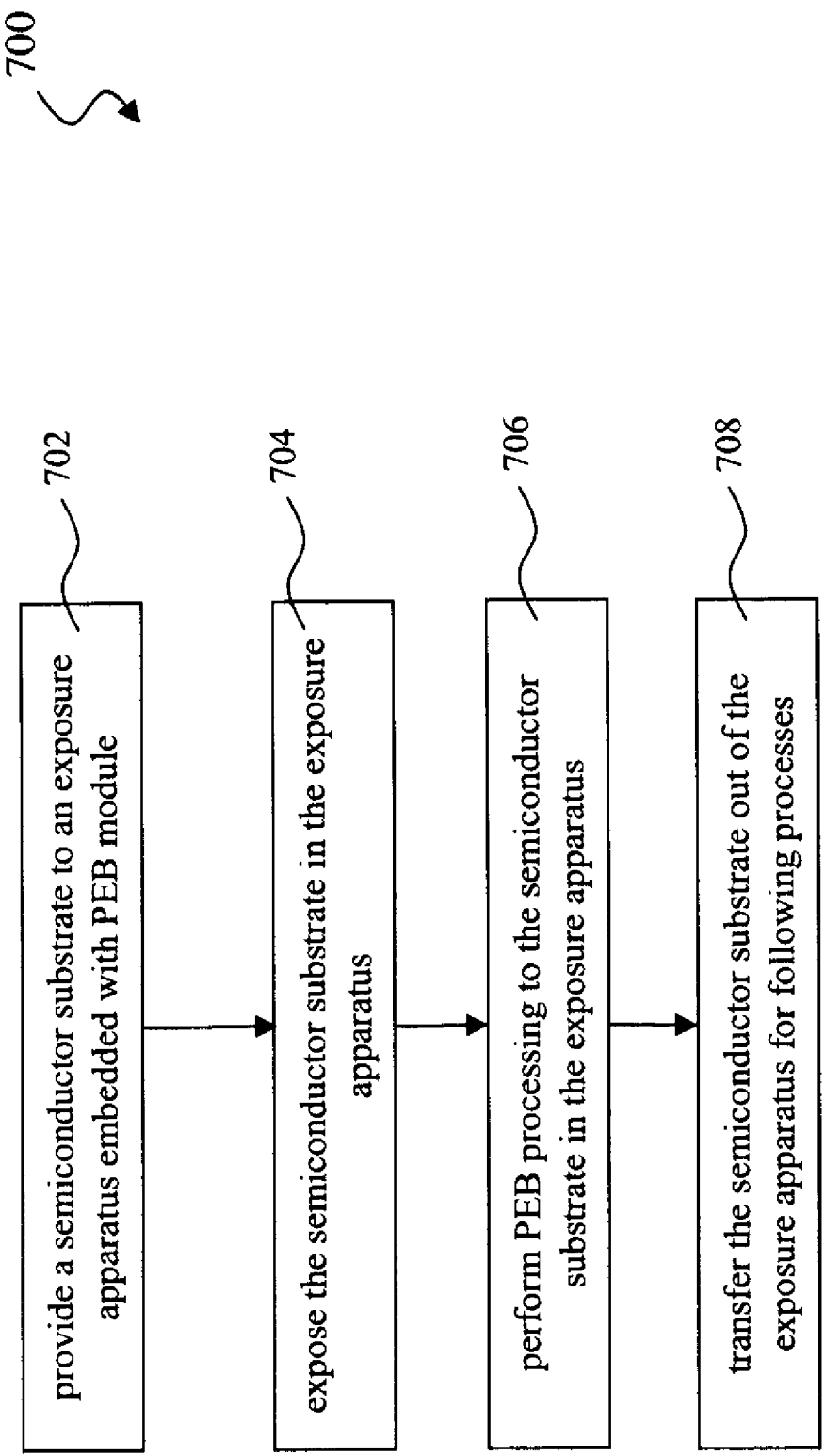
FIG. 7 is a flowchart of one embodiment of a method utilizing the lithography system of FIG. 1 or the exposure apparatus of FIG. 2 constructed according to aspects of the present disclosure.

Referring also to FIG. 7, a lithography patterning method 700 is constructed according to aspects of the present disclosure and is described below with additional reference to the FIGS. 1 to 4. The method 700 begins at step 702 by providing the substrate 226 to the PEB-embedded exposure apparatus 110. The substrate may be a semiconductor wafer or other substrates to be patterned such as a glass substrate for TFT LCD devices or fused quartz/calcium fluoride substrate for mask. In the present example, the substrate 226 is a semiconductor wafer. The substrate 226 may further include multiple patterned layers formed therein and/or thereon such as doped regions, shallow trench isolation (STI), poly-silicon gates, and metal lines and vias. The substrate 226 may include a material layer to be patterned. The substrate 226 may be further coated with an imaging layer such as photoresist. The substrate coated with the imaging layer may be further soft baked. The resist coating and soft baking processes may be implemented in the track unit 120. The substrate 226 is loaded to the substrate chuck 222 of the substrate stage 220.

The method 700 proceeds to step 704 by exposing the substrate 226 in the exposure module 112. In one embodiment, a mask is positioned on the mask stage 218. In step 704, the control module 116 of the exposure apparatus 110 may assign one baking plate of the baking module 114 for post exposure baking to the substrate 226. The control module 116 may determine when to start the exposure according to the availability of the assigned baking plate. In another embodiment, the control module may assign a baking plate according to waiting times of various baking plates in the baking module 114 and then determine when to start the exposure according to the waiting time of the assigned baking plate. In another embodiment, the control module 116 may select a predefined exposure recipe to perform the exposure to the substrate 226 wherein the exposure recipe is pre-tuned according to the assigned baking plate and is associated therewith. The predefined exposure recipe is tuned to the assigned baking plate according to the thermal variation of the assigned baking plate relative to other baking plates of the baking module 114. In this way, variations from one baking plate to another baking plate can be compensated. Further, the predefined exposure recipe may include exposure dose variations from field to field according to thermal variation from one area to area in the assigned baking plate in order to compensate within-wafer PEB deviation.

The method 700 proceeds to step 706 by performing a PEB process to the substrate 226 in the baking module 114 embedded in the exposure apparatus 110. In one embodiment, the substrate 226 is moved to the assigned baking plate for the PEB process. The PEB process may be started after the exposure with a substantial uniform post exposure delay (PED) time utilized by the PEB-embedded exposure apparatus 110. The control module 116 may use a predefined PEB recipe tuned for the assigned baking plate.

The method 700 proceeds to step 708 by transferring the substrate out of the exposure apparatus 110 for following processes such as resist developing and resist hard baking. The substrate 226 may be transferred to the clustered or standalone track unit for resist developing and resist hard baking. The substrate 226 may be further measured for CD control by an integrated metrology module in track unit and/or a standalone scanning electron microscope (SEM). Other processes may further follow such as etching or ion-implanting, and resist removal by wet stripping or plasma ashing.

The disclosed PEB-embedded exposure apparatus may have other variations, modifications, and extensions without departing from the spirit and scope of the invention. For example, the PEB module can be embedded in a lithography exposure apparatus such as a scanner for both exposure and PEB processes. The scanner may be designed to perform exposure in a scan and step mode, or other modes. In one embodiment, the disclosed PEB-embedded exposure apparatus fully controls the embedded PEB module including heating, cooling, local temperature compensation, cover open, cover close, and exhaust flow. The exposure apparatus controls baking recipes including baking temperature, baking time and other specifications for the post exposure baking, and wafer transportation from and to the embedded baking module.

In another embodiment, the embedded baking module will send back its processing data to the control module of the exposure apparatus dynamically. The data of the embedded baking module may include temperature and operation status. The temperature data may include the temperature of each local area within each embedded baking plate. The operation data may include availability, down events, and alarm events. The control module of the PEB-embedded exposure module may include additional control scenarios such as controlling the timing from the start of wafer exposure to the start of post exposure baking to guarantee uniform post exposure delay time; stopping wafer exposure if there is no available PEB plate either due to PEB process or down events; and stopping wafer exposure if the temperature of the PEB plate is out of specification. The control module may collect temperature data from each local area of each PEB plate dynamically or in a predefined schedule. The exposure recipe may be tuned, coordinated, and/or associated with each PEB plate for intra-wafer and inter-wafer compensations utilizing inter-field and/or inter recipe corrections such as exposure dose, focus, and stage tilt.

Thus, the present disclosure provides a lithography exposure apparatus. The exposure apparatus includes an exposure module designed for exposure processing; a baking module embedded in the exposure module and designed for post exposure baking (PEB); and a control module designed to control the exposure module and the baking module.

The exposure apparatus may further include an interface to couple with a track unit. The track unit may include a processing module selected from the group consisting of a resist coating module, resist developing module, an adhesion priming module, a soft baking module, a hard baking module, an integrated metrology module, and combinations thereof. The exposure apparatus may further include at least one load port for loading and unloading wafers from the lithography exposure apparatus. The baking module may further include a robot configured to transfer a wafer. The exposure module may include an illumination unit, a mask stage, an imaging lens unit, and/or wafer stage. The exposure module may further include a stage in/out unit to transfer a wafer between the exposure module and the baking module. The control module may be designed capable of relating the exposure processing and the PEB applied to a wafer for optimized post exposure delay time. The baking module may include a plurality of baking plates. The control module may be designed capable of assigning one of the plurality of baking plates to a wafer. The control module may be designed capable of utilizing an exposure recipe for the exposure processing to the wafer assigned to the one of the plurality of baking plates, wherein the exposure recipe is associated with the one of the plurality of baking plates for processing compensation. Each of the plurality of baking plate may include a hot plate for applying the PEB to a wafer; a chilling plate approximate to the hot plate, the chilling plate being designed for cooling down the wafer; and a chamber cover configured to cover the wafer in the hot plate during applying the PEB to the wafer.

The present disclosure also provides a lithography exposure system. The system includes an exposure apparatus having an exposure module designed for exposure processing and a baking module designed for post exposure baking (PEB). The system also includes a track unit coupled with the exposure apparatus and configured for photoresist processing. The exposure apparatus may further include a control module designed to control the exposure module and the baking module. The control module may be designed capable of relating the exposure processing and the PEB applied to a wafer for processing optimization and compensation. The system may further include an interface to transfer a wafer between the track unit and the exposure apparatus. The exposure module may include a radiation source providing a radiation energy; a lens system configured approximate to the radiation source; a mask stage proximate to the lens system, configured to hold a mask; and a substrate stage configured to hold a substrate and receive the radiation energy through the lens system and the mask during an exposing process. The radiation source may provide the radiation energy selected from the group consisting of an ArF excimer laser having a wavelength of 193 nm, a KrF excimer laser having wavelength of 248 nm, and a mercury excimer laser having a wavelength of 365 nm.

The present disclosure also provides a lithography patterning method. The method includes exposing a substrate to be patterned in an exposure apparatus; and baking the substrate, after the exposing, in a baking module embedded in the exposure apparatus. The method may further include assigning one of a plurality of baking plates to the substrate. The exposing of the substrate may include selecting an exposure recipe associated with the one of the plurality of baking plates assigned to the substrate. The method may further include determining when to perform the exposing to the substrate according to availability of the baking module.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:
1. A lithography exposure apparatus, comprising:
an exposure module designed for exposure processing;
a baking module embedded in the exposure module and designed for post exposure baking (PEB) wherein the baking module comprises a plurality of baking plates; and
a control module designed to control the exposure module and the baking module, wherein:
the control module includes a plurality of exposure recipes, each being tuned and associated with one of the plurality of baking plates in the baking module;
the control module is designed capable of assigning one of the plurality of baking plates to a wafer; and
the control module is designed capable of utilizing the exposure recipe tuned and associated with the one of the plurality of baking plates assigned to the wafer for the exposure processing to the wafer assigned to the one of the plurality of baking plates in such a way that compensation is provided for variations from one baking plate to another of the plurality of baking plates.
2. The apparatus of claim 1 further comprising an interface to couple with a track unit.
3. The apparatus of claim 2, wherein the track unit comprises a processing module selected from the group consisting of a resist coating module, resist developing module, an adhesion priming module, a soft baking module, a hard baking module, an integrated metrology module, and combinations thereof.

4. The apparatus of claim 1 further comprising at least one load port for loading and unloading wafers from the lithography exposure apparatus.

5. The apparatus of claim 1, wherein the baking module further comprises a robot configured to transfer a wafer.

6. The apparatus of claim 1, wherein the exposure module comprises an illumination unit, a mask stage, an imaging lens unit, and wafer stage.

7. The apparatus of claim 1, wherein the exposure module further comprises a metrology unit integrated with the exposure module.

8. The apparatus of claim 1, wherein the exposure module further comprises a stage in/out unit to transfer a wafer between the exposure module and the baking module.

9. The apparatus of claim 1, wherein the control module is designed capable of relating the exposure processing and the PEB applied to a wafer for optimized post exposure delay time.

10. The apparatus of claim 1, wherein each of the plurality of baking plate comprises:
a hot plate for applying the PEB to a wafer;
a chilling plate approximate to the hot plate, the chilling plate being designed for cooling down the wafer; and
a chamber cover configured to cover the wafer in the hot plate during applying the PEB to the wafer.

11. A lithography exposure system, comprising:
an exposure apparatus including
an exposure module designed for exposure processing, and
a baking module designed for post exposure baking (PEB) including a plurality of baking plates, wherein:
one of the plurality of baking plates is assigned to a substrate to be patterned;
the exposure apparatus includes a plurality of exposure recipes, each being tuned to and associated with one of the plurality of baking plates;
one of the plurality of exposure recipes in which the exposure recipe-is tuned and associated with the one of the plurality of baking plates assigned to the substrate is selected in such a way that compensation is provided for variations from one baking plate to another of the plurality of baking plates; and
the exposure processing utilizes the selected exposure recipe for exposing of the substrate; and
a track unit coupled with the exposure apparatus and configured for photoresist processing.

12. The system of claim 11, wherein the exposure apparatus further comprises a control module designed to control the exposure module and the baking module.

13. The system of claim 12, wherein the control module is designed capable of relating the exposure processing and the PEB applied to a wafer for processing optimization and compensation.

14. The system of claim 13, further comprising an interface to transfer a wafer between the track unit and the exposure apparatus.

15. The system of claim 11, wherein the exposure module comprises:
a radiation source providing a radiation energy;
a lens system configured approximate to the radiation source;
a mask stage proximate to the lens system, configured to hold a mask; and
a substrate stage configured to hold a substrate and receive the radiation energy through the lens system and the mask during an exposing process.

16. The system of claim 15, wherein the radiation source provides the radiation energy selected from the group consisting of an ArF excimer laser having a wavelength of 193 nm, a KrF excimer laser having wavelength of 248 nm, and a mercury excimer laser having a wavelength of 365 nm.

17. A lithography patterning method, comprising:
assigning one of a plurality of baking plates to a substrate;
providing a plurality of exposure recipes, each being tuned and associated to one of the plurality of baking plates,
exposing the substrate to be patterned in an exposure apparatus, wherein:
exposing of the substrate comprises selecting an exposure recipe from the plurality of exposure recipes tuned and associated with the one of the plurality of baking plates assigned to the substrate in such a way that compensation is provided for variations from one baking plate to another of the plurality of baking plates; and
baking the substrate, after the exposing, in a baking module embedded in the exposure apparatus.

18. The method of claim 17 further comprising determining when to perform the exposing to the substrate according to availability of the baking module.

* * * * *